(12) United States Patent
Aronowitz et al.

(10) Patent No.: US 6,673,498 B1
(45) Date of Patent: Jan. 6, 2004

(54) METHOD FOR RETICLE FORMATION UTILIZING METAL VAPORIZATION

(75) Inventors: Sheldon Aronowitz, San Jose, CA (US); Vladimir Zubkov, Mountain View, CA (US); Richard Schinella, Saratoga, CA (US)

(73) Assignee: LSI Logic Corporation, Milpitas, CA (US)

( * ) Notice: Subject to any disclaimer, the term of this patent is extended or adjusted under 35 U.S.C. 154(b) by 235 days.

(21) Appl. No.: 10/053,537

(22) Filed: Nov. 2, 2001

(51) Int. Cl.$^7$ .................................................. G03F 9/00
(52) U.S. Cl. ........................................... 430/5; 430/314
(58) Field of Search ............................ 430/5, 314, 323, 430/324

(56) References Cited

U.S. PATENT DOCUMENTS 5,741,613 A * 4/1998 Moon et al. .................... 430/5
6,197,456 B1 * 3/2001 Aleshin et al. ................ 430/5

* cited by examiner

Primary Examiner—Christopher G. Young
(74) Attorney, Agent, or Firm—Beyer, Weaver & Thomas LLP

(57) ABSTRACT

A method of forming a reticle is provided. In general, a metal containing material is vaporized through simple vaporization. The metal containing material is condensed on a substrate to form a metal containing layer on the substrate. A patterned photoresist layer is formed over the metal containing layer, defining exposed metal containing layer regions and covered metal containing layer regions. The metal containing layer in the exposed metal containing layer regions is removed from the substrate, while the metal containing layer in the covered metal containing layer regions remains on the substrate to form a metal containing mask. The substrate is plasma etched. The remaining metal containing layer is removed from the substrate.

19 Claims, 10 Drawing Sheets

METHOD FOR RETICLE FORMATION UTILIZING METAL VAPORIZATION

FIELD OF THE INVENTION

The present invention relates generally to the creation of reticles. More specifically, the invention relates to creation of phase shift reticles.

BACKGROUND OF THE INVENTION

A "wafer" is a thin piece of semiconductor material from which semiconductor chips are made. In various steps of forming semiconductor chips, photoresist masks may be formed. Errors in forming these masks may cause distortions that cause changes in the functions of these electronic devices. The photoresist masks may be used to create parts of the semiconductor device on the wafer surface in the dimensions required by the circuit design and to locate the parts in their proper location on the wafer surface. Design rule limitations frequently are referred to as critical dimensions. A critical dimension of a circuit is commonly defined as the smallest width of a line or the smallest space between two lines. The critical dimension is a limit to the smallest feature that can be reliably patterned by a given patterning process.

In a process of patterning a photoresist mask a photosensitive polymer film called photoresist is normally applied to a silicon substrate wafer and then allowed to dry. A lithographic tool may provide a light source passing through a reticle may be utilized to produce a light pattern on the photoresist, creating an exposed pattern of the photoresist. After exposure, the photoresist layer is developed to form a photoresist mask. The photoresist mask may then be used as a mask for etching, doping, depositing, or other processes in forming the semiconductor chips from the wafer.

An important limiting characteristic of the lithographic device is its resolution value. The resolution for a lithographic device is defined as the minimum feature that the lithographic device may consistently expose onto the wafer. When the resolution value of lithographic equipment is close to the critical dimension for an IC circuit design, the resolution of the lithographic device may influence the final size and density of the IC circuit. As the critical dimensions of the layout become smaller and approach the resolution value of the lithographic equipment, the consistency between the masked and actual layout pattern developed in the photoresist is significantly reduced. Specifically, it is observed that differences in pattern development of circuit features depend upon the proximity of the features to one another. The magnitude of such proximity effects depends on the proximity or closeness of the two features present on the masking pattern. Proximity effects are known to result from optical diffraction caused by the lithographic device. This diffraction causes adjacent features to interact with one another in such a way as to produce pattern-dependent variations. As a consequence of proximity effects, printed features do not have simple relationships to reticle dimensions. This creates a situation in which it is difficult to fabricate a photomask where the designer gets what he or she wants on the wafer.

Phase shifting often can significantly improve resolution by using destructive (rather than constructive) interference of the tail portions of the diffraction distributions from adjacent features on a mask. Various techniques have been proposed for phase shift, or optical proximity correction (OPC) mask fabrication.

These conventional techniques ordinarily are implemented in one of two ways. In one, a layer of phase shifting material is added to a reticle and then etched to produce the desired phase shift as in U.S. Pat. No. 5,741,613. In the other, the reticle itself is etched to a sufficient depth to produce the desired phase shift. The thickness and refractive index of the phase shifting material is sufficient to exactly shift the incident light by 180 degrees with respect to light that does not pass through the phase shifting material. One representative example is U.S. Pat. No. 6,197,456, where a reticle blank has a transparent layer and a non-transparent layer. Usually, the reticle blank has a transparent synthesized quartz substrate where multiple and different types of phase-shifting elements are etched into its surface.

Known methods may use a refractory metal, such as chrome, as a mask to etch the OPC pattern onto the phase-shift layer. Such refractory metals generally have a melting point that is greater than 1500° C. Because of the very high melting point of refractory metals, relatively high-energy deposition methods, such as sputtering, may be required to deposit a film onto the reticle substrate. Beyond the additional logistical process difficulties and cost, an unfortunately consequence of high-energy deposition methods is the increased likelihood of damaging the transparent reticle substrate as it is bombarded by metal atoms with very high kinetic energy. It is generally more difficult to control the deposition of refractory metals on the substrate, usually resulting in films that are relatively thick, and not uniform. Moreover, relatively aggressive methods may be required to etch and remove refractory metals, which may result in further damage to substrate. Thus, inexpensive mask creation techniques using simple, easy to control agents and methods would be highly desirable.

SUMMARY OF THE INVENTION

To achieve the foregoing and other objects and in accordance with the purpose of the present invention, a method of forming a reticle is provided. In general, a metal containing material is vaporized through simple vaporization. The metal containing material is condensed on a substrate to form a metal containing layer on the substrate. A patterned photoresist layer is formed over the metal containing layer, defining exposed metal containing layer regions and covered metal containing layer regions. The metal containing layer in the exposed metal containing layer regions is removed from the substrate, while the metal containing layer in the covered metal containing layer regions remains on the substrate to form a metal containing mask. The substrate is plasma etched. The remaining metal containing layer is removed from the substrate.

In another embodiment of the invention a reticle is provided. In general, a metal containing material is vaporized through simple vaporization. The metal containing material is condensed on a substrate to form a metal containing layer on the substrate. A patterned photoresist layer is formed over the metal containing layer, defining exposed metal containing layer regions and covered metal containing layer regions. The metal containing layer in the exposed metal containing layer regions is removed from the substrate, while the metal containing layer in the covered metal containing layer regions remains on the substrate to form a metal containing mask. The substrate is plasma etched. The remaining metal containing layer is removed from the substrate.

BRIEF DESCRIPTION OF THE DRAWINGS

The present invention is illustrated by way of example, and not by way of limitation, in the figures of the accompanying drawings and in which like reference numerals refer to similar elements and in which.

It is to be understood that in the drawings like reference numerals designate like structural elements. Also, it is understood that the depictions in the Figures are not necessarily to scale.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well-known process steps and/or structures have not been described in detail in order to not unnecessarily obscure the present invention.

Figure 1:
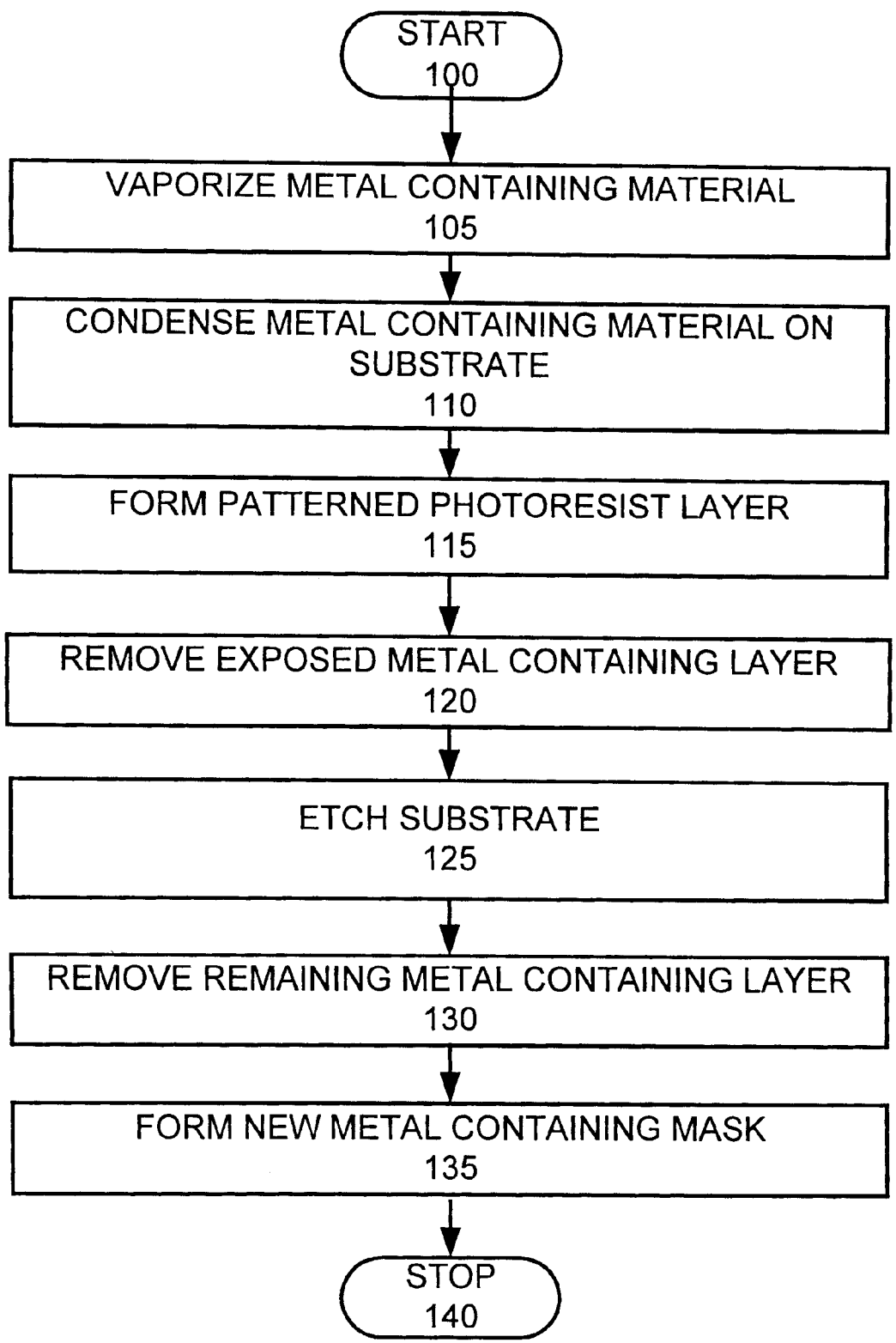
FIG. 1 is a flowchart describing a general method for forming a reticle in accordance with the principles of the present invention.

FIG. 1 is a flowchart describing a general method for forming a reticle in accordance with the principles of the present invention. In the figure, the process starts at step 100 with a suitable blank substrate. A metal containing material is vaporized (step 105). Preferably simple vaporization is used to vaporize the metal containing material from a solid or liquid form to a vapor form. Components of a metal containing material may be separately vaporized. The vaporized metal containing material is then condensed on a reticle substrate (step 110). The reticle substrate is preferably transparent an optical or other beam used to expose the photoresist. Preferably, such a reticle substrate may be quartz. Preferably, the condensation relies on a substrate that is at a temperature that results in vapor condensation. A photoresist is then patterned over the metal containing layer (step 115) defining exposed metal containing layer regions not covered by the photoresist pattern and covered metal containing layer regions covered by the photoresist pattern. The exposed metal containing material then removed (step 120). The substrate is then etched using the metal containing layer to define an etch pattern (step 125). Various etching processes may be used, such as plasma etching or etching with a reactive ion etch. For a quartz substrate a reactive ion etch may use $CHF_3$/CO/Ar as an etchant. The remaining metal containing layer may then be removed (step 130). A new metal containing mask may then be patterned on the substrate (step 135). This new mask may be used to provide a photoresist illumination pattern. Such a mask may be made from a refractory metal.

Figure 2:
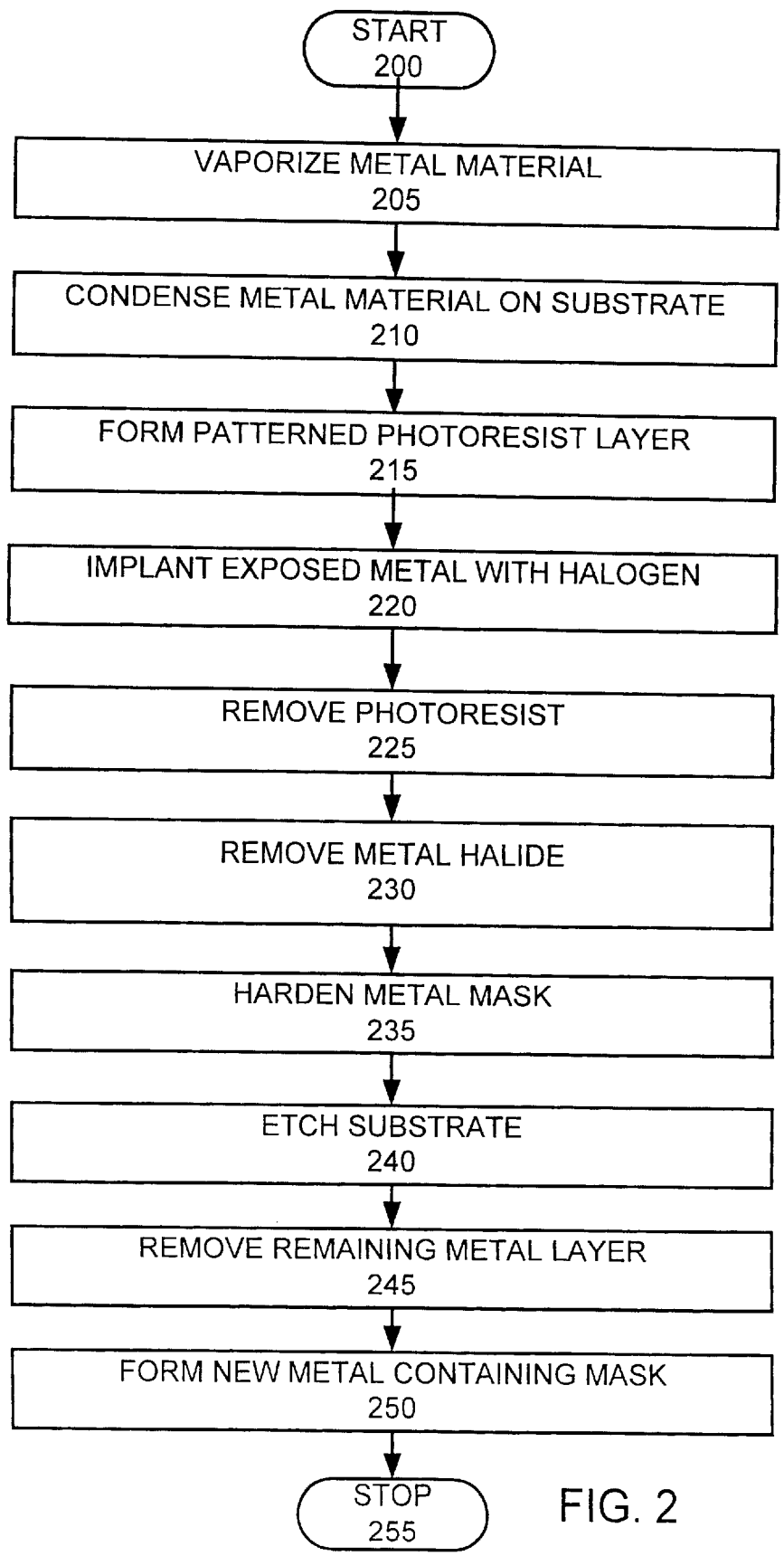
FIG. 2 is a flowchart describing a first method embodiment for forming a reticle in accordance with the principles of the present invention.

FIG. 2 shows a more detailed flow chart detailing the first embodiment of the present invention, using the general process illustrated in FIG. 1. Throughout the description various process examples are given for particular materials. It should be appreciated that this information is given solely by way of example to those skilled in the art. For example, although many suitable metals could be used herein, for simplicity of description, and not limitation, aluminum and zinc are given as a representative metals.

Figure 3:
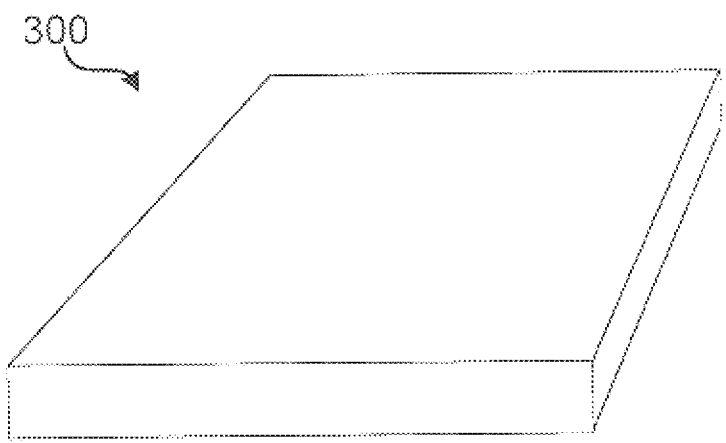
FIGS. 3–14 illustrate successive steps in the reticle formation process shown in FIG. 2.
Figure 4:
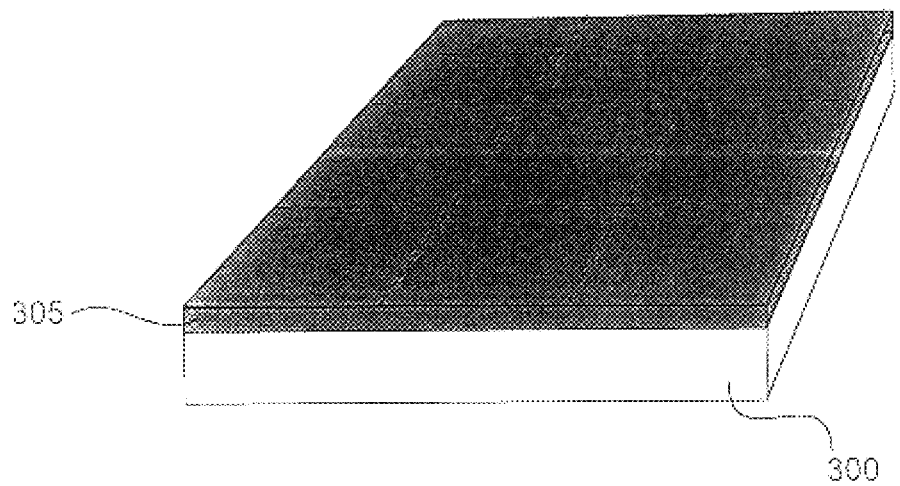

The reticle formation process begins (step 200) with a blank reticle substrate 300 illustrated in FIG. 3. Preferably the substrate is a transparent material, which allows a beam, such as a beam of light to pass through the substrate. More preferably, the substrate is synthetic quartz. A metal is vaporized (step 205). This is a specific example of the more general step of vaporizing a metal containing layer (step 105) of FIG. 1. By way of example, the vaporized metal is aluminum, which has a vapor pressure of about 7.5 mTorr at 1209° C. The vaporized metal is condensed on the blank substrate 300 (step 210), which is a specific example of the more generalized step of condensing the metal containing layer on the substrate (step 110). FIG. 4 illustrates the deposition of metal film 305 onto the substrate 300. The simple vapor deposition of aluminum may occur in a high vacuum reactor chamber forming a sequence of monolayers until the desired film thickness is achieved. A suitable film thickness would be about 40 nm, although other thickness may also be used. For simplicity, a three by three grid, shown by dashed lines, is used as the patterning resolution for this example.

Figure 5:
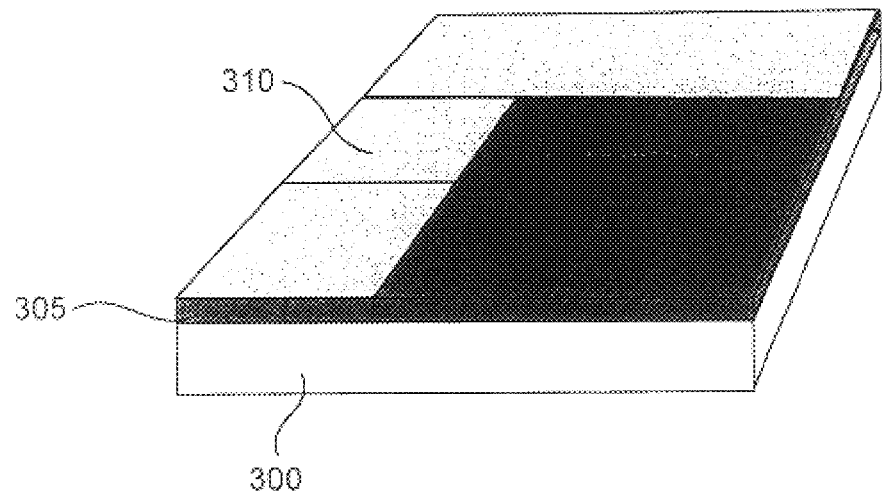
Figure 6:
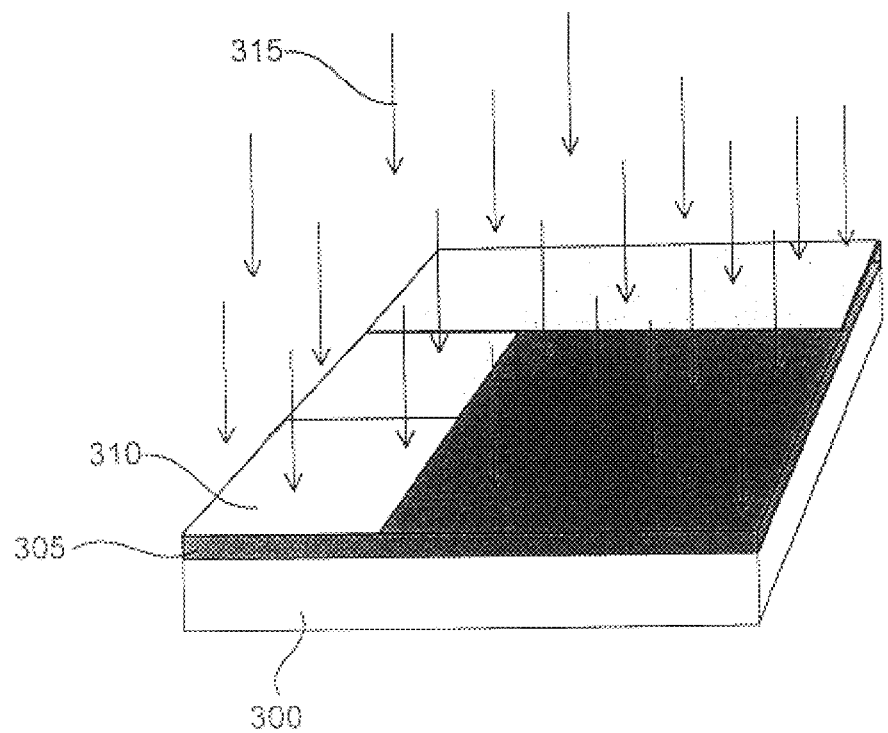
Figure 7:
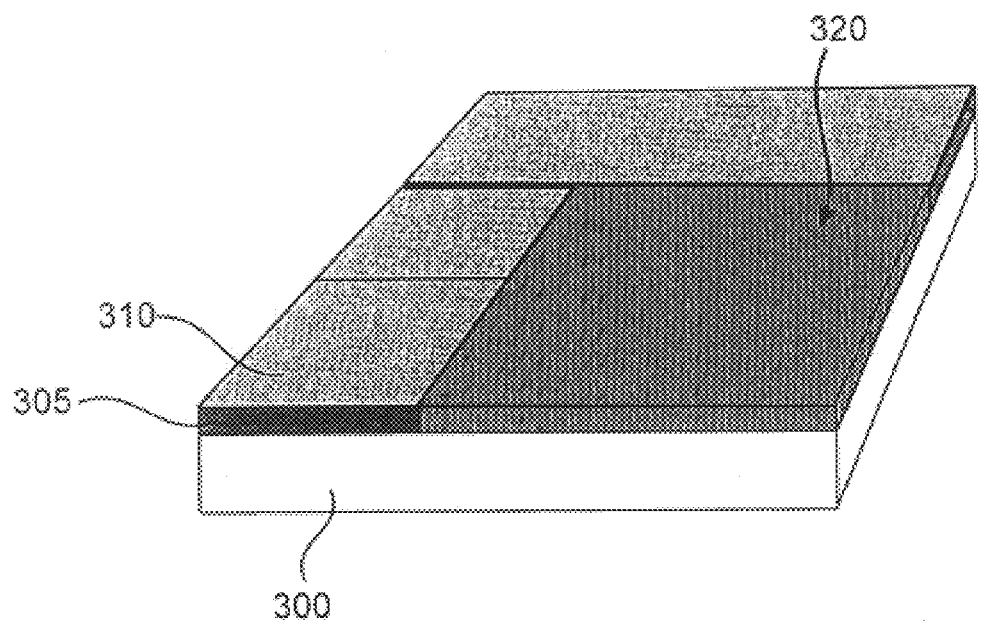
Figure 8:
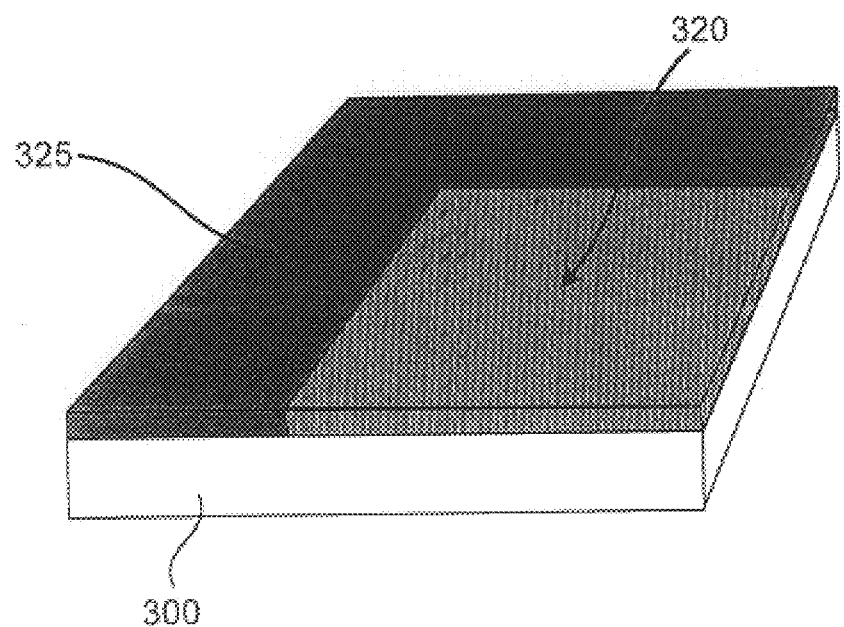
Figure 9:
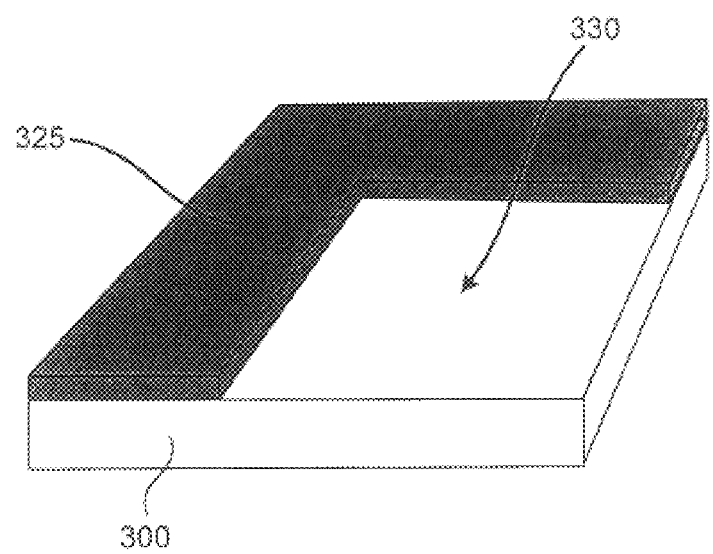

A patterned photoresist layer 310 is formed over the metal layer 305, shown in FIG. 5 (step 215 and step 115), providing exposed regions not covered by photoresist and covered regions covered by photoresist. A halogen implant 315, illustrated in FIG. 6, implants the exposed regions of the metal layer forming metal halides from the exposed regions of the metal layer (step 220). In this example, the implantation occurs by subjecting the exposed metal regions to a low energy chlorine plasma. In other embodiments low energy high dose plasmas of other halogens, such as iodine and bromine may be used. The halogen is implanted throughout the depth of the exposed regions of the metal film in this example. The low energy plasmas used in the present invention do not damage the substrate as can occur in known higher energy techniques. As illustrated in FIG. 7, the halogen implantation creates metal-halide region 320 in metal film regions exposed by photoresist 310. The photoresist is removed (step 225) to reveal desired metal pattern 325, as shown in FIG. 8. The differentiated metal-halide material 320 is removed (step 230). By way of example, $AlCl_3$, can be vaporized by raising its temperature to about 80° C. where $AlCl_3$ has a vapor pressure of about 80 mTorr, which leaves the aluminum that was in the covered regions. FIG. 9 illustrates the substrate after the metal halide material is removed as indicated above, exposing region 330 of the substrate for future etching. The steps from the step of implanting the exposed metal with halogen to the step of removing the metal halide (from step 220 to step 230) provide more detailed steps of an embodiment of the single more general step of removing the exposed metal containing layer (step 120).

Figure 10:
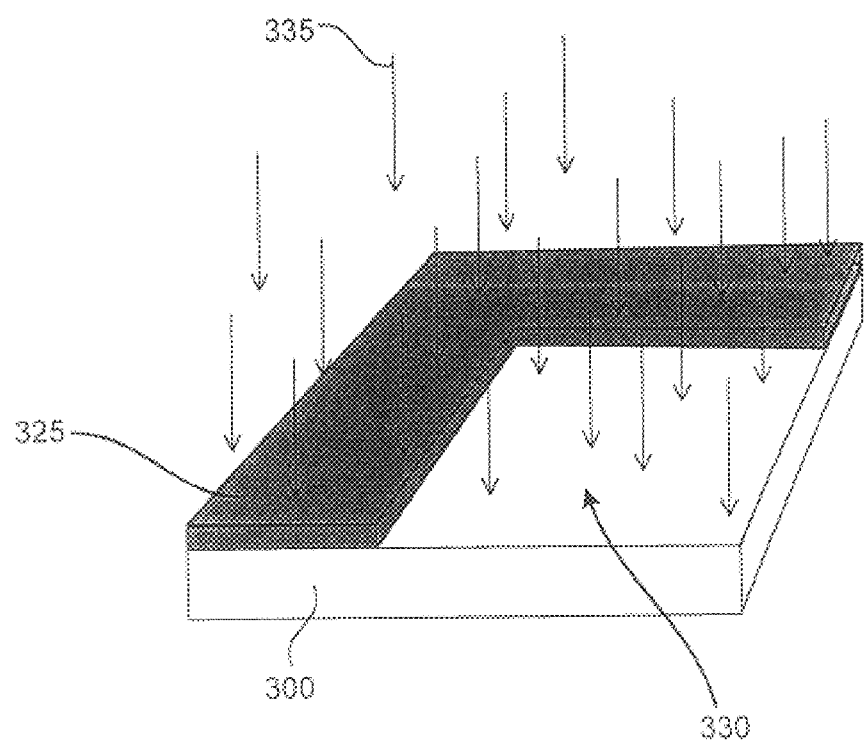

Prior to etching the substrate, mask 325 may be passivated (hardened) against substrate etching agents by an appropriate hardening process (step 235). Different metals hardening processes are available to harden the remaining metal containing layer against etching during the substrate etch. The hardening agent should be chosen to result in a hardened mask that is also easy to remove after etching the substrate. By way of example, a hardening method may include exposing substrate mask 325 to an atomic fluorine flux or a very low energy fluorine plasma 335 illustrated in FIG. 10. The low energy, hardening agent will penetrate a surface layer of the mask. The hardening step may be a step that is added to the generic process, shown in FIG. 1.

Figure 11:
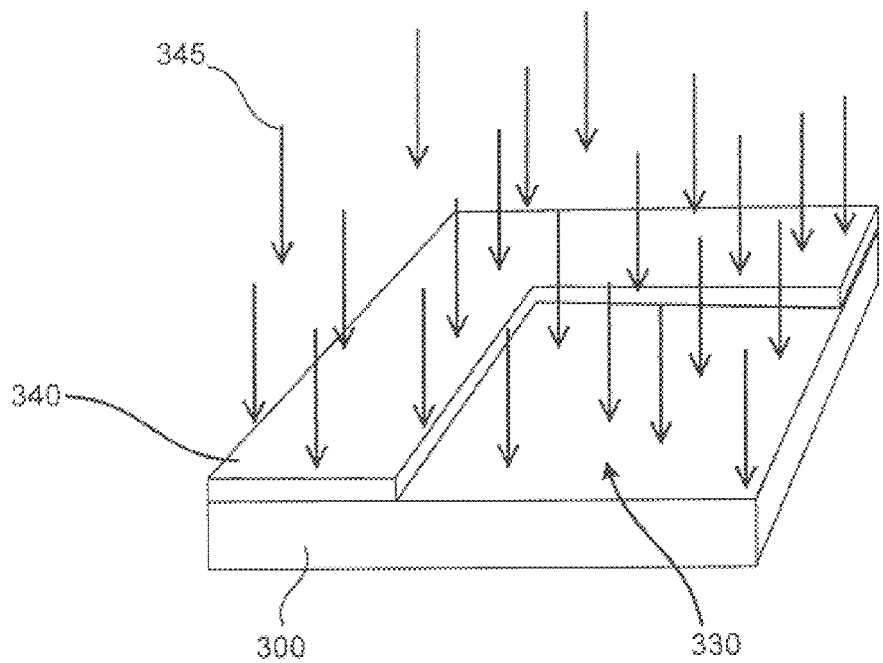
Figure 12:
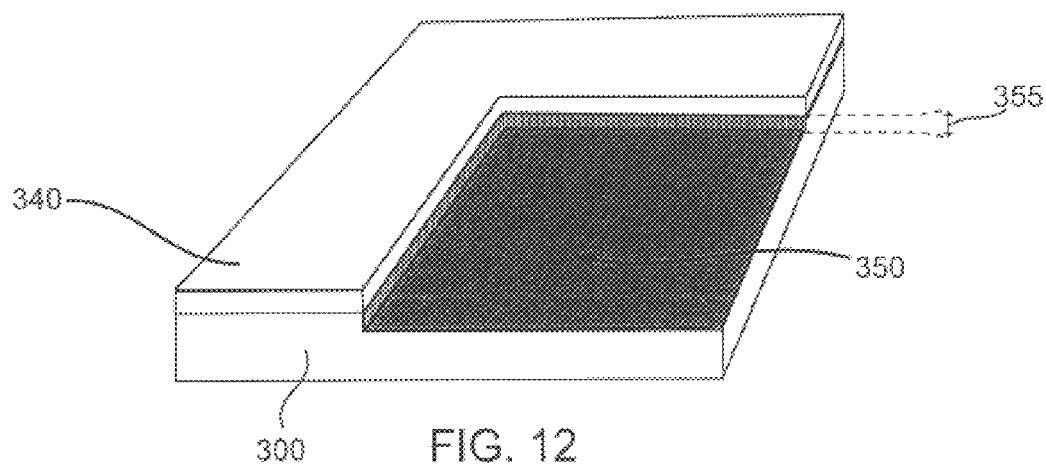

With the hardened metal mask 340, substrate 300 is etched (step 240) by etching agent 345 shown in FIG. 11. Any suitable substrate etching agent that is able to selectively etch the substrate faster than the hardened metal mask may be used. At this point, the substrate, illustrated in FIG. 12, has feature 350 etched into the substrate with depth 355. It should be appreciated that while the example shows only one etched feature, an arbitrarily complex mask 340 would pattern a multiplicity of such etched features 350.

Figure 13:
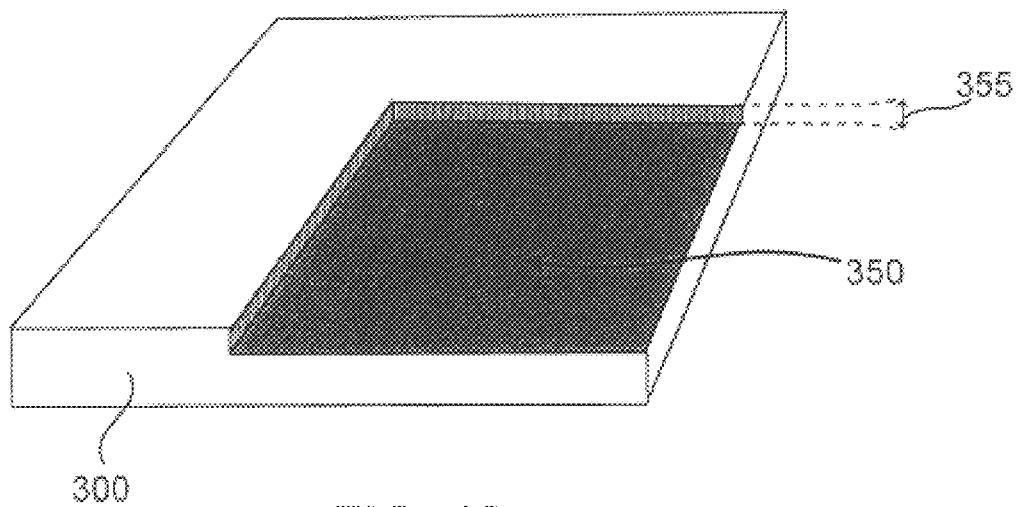
Figure 14:
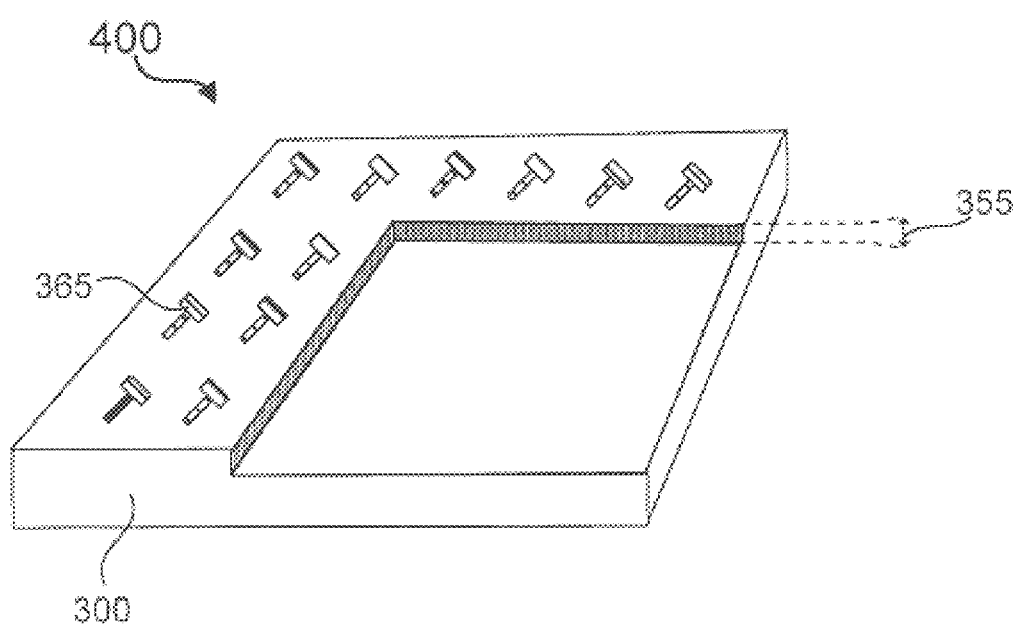

The hardened metal mask may then be removed (step 245). The substrate may be heated to a temperature of 1209° C. so that the remaining aluminum is vaporized or chemical mechanical polishing may be used to remove the remaining aluminum. Other removal methods may also be used. The etched substrate is illustrated in FIG. 13. The substrate is suitable for further processing depending on the particular application to form a completed reticle. For example, a new metal containing mask 365 may be formed on the surface of the etched substrate as shown in FIG. 14 (step 250 and step 135). The resulting reticle 400 may be used in an lithographic device. A refractory metal may be deposited by ion sputtering to form the new metal containing mask, since it may not be the same requirement to remove the new metal containing mask as there was the first metal containing mask. A nonrefractory metal may be used to avoid quartz damage from ion sputtering.

If the reticle is to be used as an optical proximity correction (OPC) mask for semiconductor lithography, substrate 300 could be a transparent synthesized quartz substrate patterned according to the present invention with multiple and different types of phase-shifting elements etched into its surface. Different types of phase-shifting elements could be created by iterating steps 200–245 with a different photoresist masks in step 210 such that certain previously etched areas 350 are etched again to a deeper depth, and the other previously etched areas not etched. This process could be repeated as many times as desired, to produce a multiplicity of etched areas with different depths. Those skilled in the art will find apparent many other applications that are achievable by applying additional processing steps to reticles formed according to the present invention.

In other embodiments, the vaporization temperature for other aluminum halides (e.g., $AlBr_3$ or $AlI_3$) would not exceed 150° C. In the alternative, ethyl alcohol may be used as a wet process of removing $AlCl_3$, instead of vaporization. Benzene or toluene may be used to dissolve and remove $AlBr_3$. Alcohol or ether may be used to dissolve and remove $AlI_3$.

In another embodiment of the invention, zinc may be used in place of aluminum. Zinc and its halides function similarly to aluminum except that zinc has a vapor pressure of about 7.5 mTorr at 337° C. instead of 1209° C. The zinc halides, such as $ZnCl_2$, $ZnBr_2$, and $ZnI_2$, may be dissolved using ethyl alcohol. In instead vaporization is used to remove the zinc halides, since the vapor pressure of zinc and its halides are too close to differentiate, the exposed zinc metal film may be first exposed to a fluorine flux and converted to $ZnF_2$ to sufficiently distinguish its vapor pressure from that of zinc. Similar methods apply to cadmium and lithium. Other vaporization techniques to remove metal halides from adjacent metal films may also be used.

In another embodiment, beryllium may be used as the metal film. An advantage provided by beryllium is that beryllium fluoride ($BeF_2$) is soluble in water. This may allow exposed regions of beryllium to be converted to $BeF_2$. The $BeF_2$ of the exposed regions may be removed by water, while removing the photoresist. In addition, the beryllium may be plasma hardened using a fluorine plasma to convert the remaining regions of beryllium to $BeF_2$. Removal of the remaining hardened etch mask may then be removed by water. However, the substrate etching agent should not contain significant amounts of oxygen because this might yield a BeO rich surface layer which would be highly resistant to removal by water. Other suitable metals in this embodiment may be cadmium and lithium, which may be ones that can form metal halides.

Depending on the depth of hardening, a second removal method may be required to completely remove all metal mask material. In the case of beryllium, if it was hardened with a low energy fluorine flux, it is possible that only a surface layer of $BeF_2$ was formed. In this case, after removing $BeF_2$ with water the underlying beryllium metal must also be etched. For other metals, such as cadmium, the mask could be vaporized by adequately heating the substrate in a vacuum. Methods of mask removal such as by heating the substrate may not be possible in prior art methods that use refractory metals, because the refractory temperatures required to vaporize the metal mask may likewise melt or otherwise damage the substrate.

Figure 15:
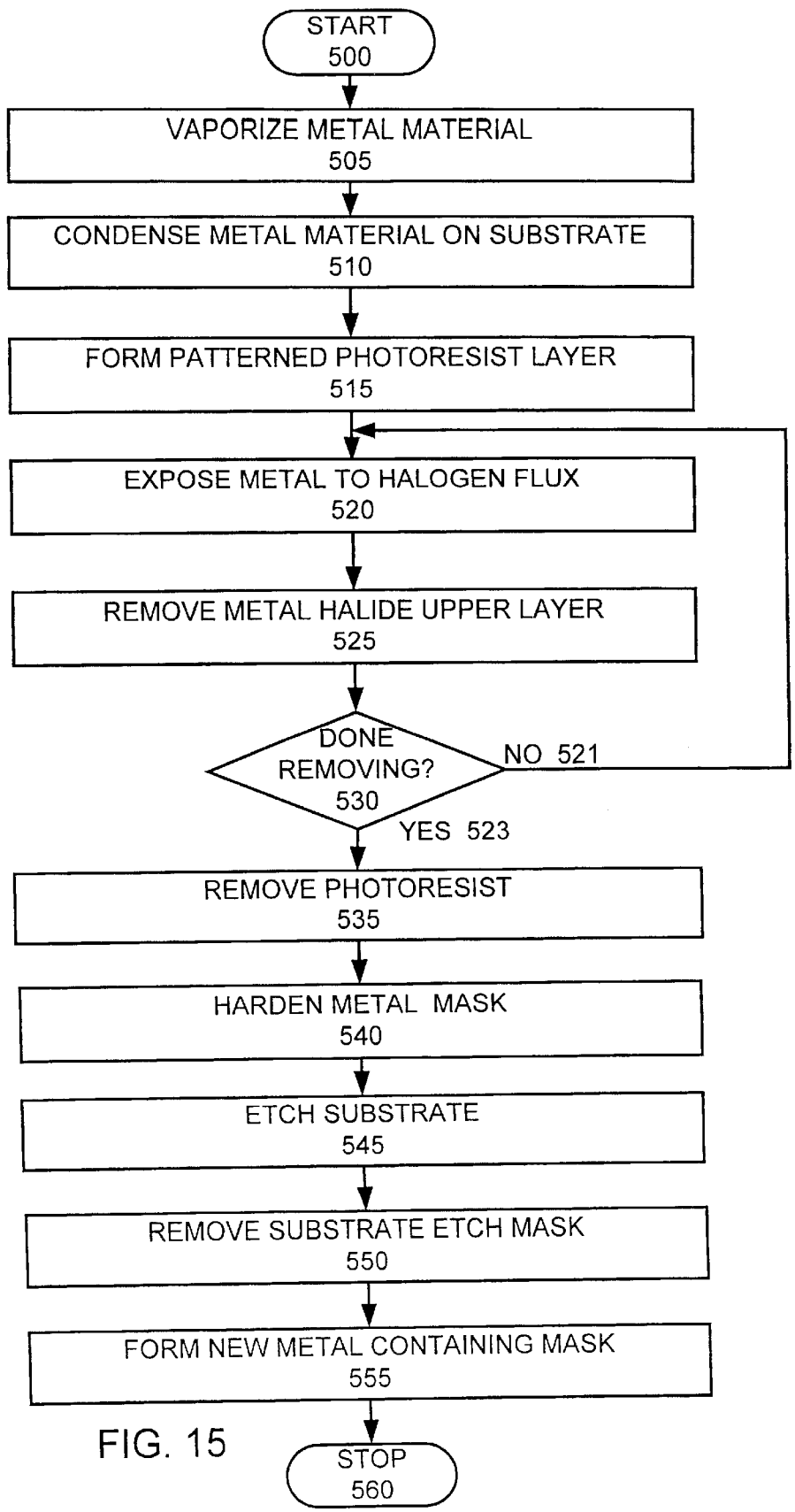
FIG. 15 is a flowchart describing a second method embodiment for forming a reticle in accordance with the principles of the present invention.

As another example process of the general method shown in FIG. 1, a flow chart for the second embodiment of the present invention is illustrated in FIG. 15. A non-refractory metal material is vaporized (step 505). In this example, the metal is cadmium with a vapor pressure of about 7 mTorr at about 257° C. The metal material is condensed upon a reticle substrate (step 510) to form a metal film. A photoresist layer is patterned on the metal film exposing metal film regions for removal (step 515). The exposed metal film regions are exposed to a halogen (step 520) to form metal halide regions for removal, resulting in structure similar to FIG. 7. The exposure may be performed by exposure to a plasma flux. Such a flux with lower energy ions, may cause only a top surface of the exposed metal containing layer to become a halide. Other chemical reactions may also limit the formation of the metal halide to an upper surface of the exposed metal region. In this example, the plasma flux is atomic bromine plasma with a low kinetic energy, so that only the top most cadmium layer will form $CdBr_2$. The halide metal is removed (step 525). Since only an upper layer of the exposed metal region is transformed to a halide, only the upper layer of the exposed metal region is removed. In this example, ethyl alcohol is used to dissolve and remove the $CdBr_2$, which is in only the top most layer of the cadmium. $CdBr_2$ is soluble in ethyl alcohol, with a bulk solubility of about 26 g per 100 cc. A determination may be made to see if all of the exposed metal has been removed. If all of the exposed metal in the exposed metal region was not removed (branch 521), the exposed surface is again exposed to a halogen to form another metal halide upper surface (step 520) and again the metal halide upper surface is removed (step 525). This iterative removal procedure repeats until the layer in the exposed metal layer regions is substantially removed (branch 523). The steps from the step of implanting the exposed metal with halogen to the step of removing all the exposed meal (from step 520 to step 530) provide more detailed steps of an embodiment of the single more general step of removing the exposed metal containing layer (step 120). The photoresist is removed (step 535). The metal substrate etching mask is hardened (step 540). In this example, a flux of oxygen or atomic fluorine may be used to harden a top surface of the cadmium. The substrate is etched (step 545). The mask is removed (step 550).

In another embodiment, iodine may be used in place of bromine, since cadmium iodide is more soluble in ethyl alcohol (110 gm per 100 cc) and is also soluble in methyl alcohol (207 gm per 100 cc), and acetone (41 gm per 100 cc).

Metals belong to groups IIA (e.g., Ca) and IIB (e.g., Cd) may be suitable to use this process. These metals have the property of being both unreactive with and insoluble in water. These metals further have the property of having stable fluorides and oxides.

Figure 16:
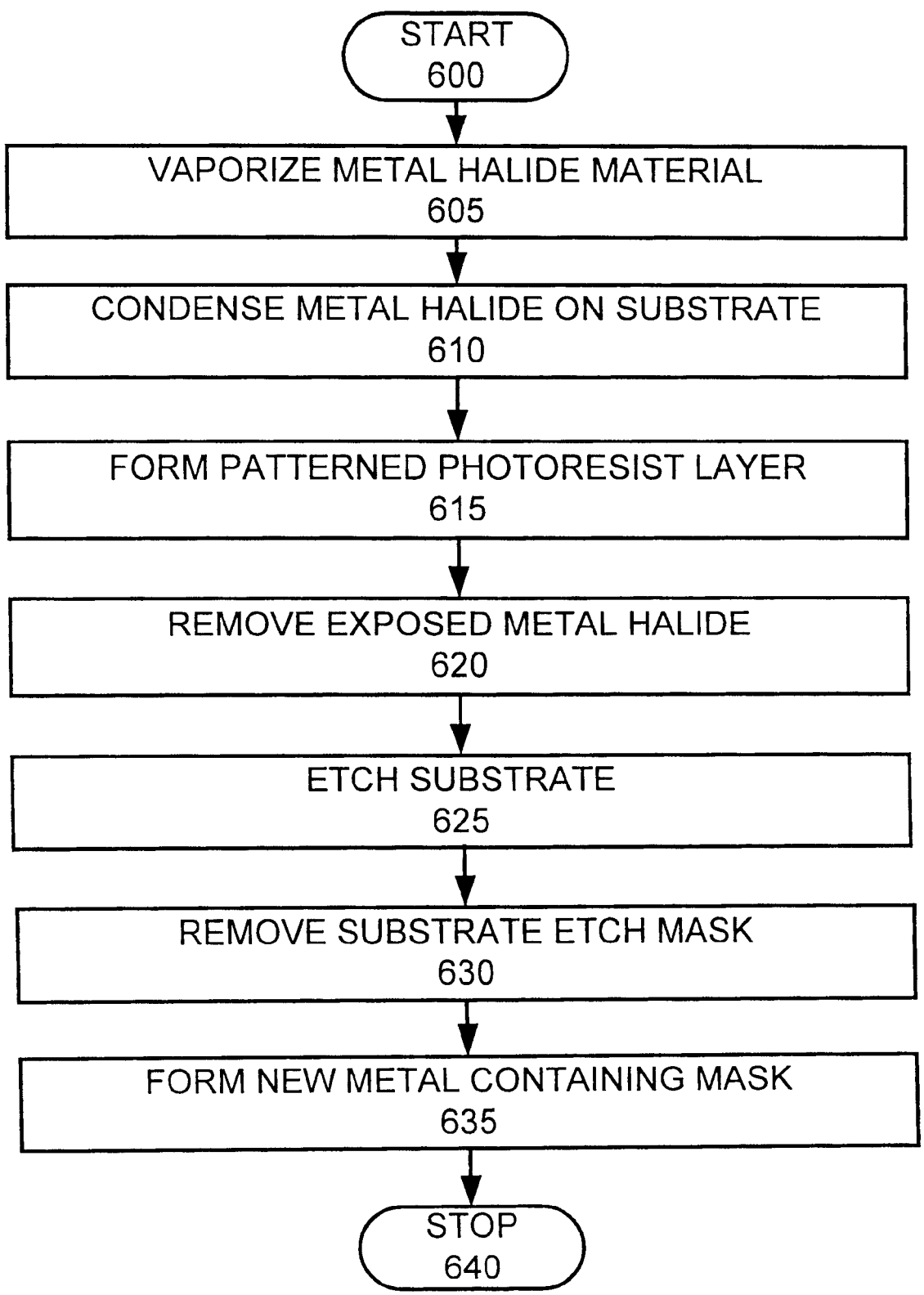
FIG. 16 is a flowchart describing third method embodiment for forming a reticle in accordance with the principles of the present invention.

In yet another example process of the general method illustrated in FIG. 1, a flow chart for the third embodiment of the present invention is illustrated in FIG. 16. The third embodiment is, likewise, similar to the first embodiment with the exception of requiring no patterned halogen implantation of the metal film. This is advantageously avoided by the selection of unique compounds, which have a relatively high vapor pressure at low temperature, and have potent solvents that do not dissolve the photoresist used in the process. Compounds with suitable sublimation properties and solubility characteristics include the halides of zirconium and hafnium. The third embodiment of the present invention is described using zirconium tetrabromide, $ZrBr_4$, for illustrative purposes. Although zirconium may be a refractory metal, the vapor pressure of solid $ZrBr_4$ at 136° C. is approximately 7 mTorr. In a suitable reaction chamber, $ZrBr_4$ is vaporized (step 605). The $ZrBr_4$ compound is vaporized in this embodiment, although in other embodiments a metal and halogen may be separately vaporized, with the vapors being combined in the reaction chamber. The $ZrBr_4$ is condensed onto a quartz substrate, where the substrate is maintained at a temperature that permits condensation of the $ZrBr_4$ vapor into a film containing several layers through simple vapor deposition (step 610). Importantly, in the preferred embodiment, the $ZrBr_4$ film is physisorbed not chemisorbed. This characteristic permits later removal of the completed $ZrBr_4$ substrate etch mask simply by heating the $ZrBr_4$, which may be done by heating the substrate. After deposition, photoresist is then patterned over the $ZrBr_4$ layer to provide expose regions of the $ZrBr_4$ layer and covered regions of the $ZrBr_4$ layer (step 615). The photoresist layer is then cured. During the process of curing the photoresist, much of the exposed $ZrBr_4$ can be removed (step 620) by maintaining a relatively high vacuum in the reaction chamber (vapor pressure of $ZrBr_4$ is about 2 mTorr at 120° C.). Any remaining exposed $ZrBr_4$ can be removed by further low temperature heating of the substrate. In this example, the substrate may be etched without the photoresist (step 625). The step of removing the exposed metal halide provides a more detailed step of an embodiment of the single more general step of removing the exposed metal containing layer (step 120). As a result, the photoresist and the $ZrBr_4$ act as an etch mask. Remaining photoresist may be etched away by the plasma. A fluorine plasma may interact with the zirconium tetrabromide to produce a surface layer of zirconium fluoride, which would be more resistant to etching. After etching the $ZrBr_4$ etch mask, remaining photoresist, and a surface layer of zirconium fluoride may be removed (step 630). Several methods are available to remove the $ZrBr_4$ etch mask and remaining photoresist after substrate etching. Preferably, physical, rather than chemical, means are used. Suitable physical means include raising the reticle temperature to approximately 250° C. In this case, the vapor pressure of the $ZrBr_4$ under the photoresist layer will be at least 1 Torr. The photoresist or surface layer of zirconium fluoride acts as a vapor stop covering the $ZrBr_4$, and the whole substrate mask will lift. Substantially all the residual $ZrBr_4$ can be removed either by acetone treatment, or by raising the substrate temperature to at least 136° C. under vacuum conditions. In another example, because $ZrBr_4$ is very soluble in water, a steam bath can be used to efficiently remove the $ZrBr_4$ substrate mask. Importantly, if the substrate is made of quartz, this embodiment of the present invention is suitable for applications where a surface monolayer of a Si—O—Zr type structure is acceptable. A monolayer of a Si—O—Zr type structure can form at the quartz interface that reacted with hydroxyl groups present during the prior 250° C. lift procedure. A new metal mask is then formed on the substrate to form the reticle (step 635). Although $ZrBr_4$ was used as example in this embodiment, the foregoing aspects and descriptions equally apply to the halides of zirconium and hafnium, and other compounds with similar characteristics.

In another embodiment, the photoresist may be removed by a solvent used to form the photoresist pattern. The solvent that forms the developed photoresist into a mask pattern may also dissolve the exposed $ZrBr_4$. If a halogen containing plasma is used to etch the substrate, the $ZrBr_4$ is hardened against plasma etching in situ, where a protective surface layer forms during exposure that blocks further reaction between the mask and the plasma. Other hardening process may also be used in the embodiment.

While this invention has been described in terms of several embodiments, there are alterations, modifications, permutations, and substitute equivalents, which fall within the scope of this invention. It should also be noted that there are many alternative ways of implementing the methods and apparatuses of the present invention. It is therefore intended that the following appended claims be interpreted as including all such alterations, permutations, and substitute equivalents as fall within the true spirit and scope of the present invention.

What is claimed is:

1. A method of forming a reticle comprising:

vaporizing a metal containing material, through simple vaporization;

condensing the metal containing material on a substrate to form a metal containing layer on the substrate;

forming a patterned photoresist layer over the metal containing layer, defining exposed metal containing layer regions and covered metal containing layer regions;

removing the metal containing layer in the exposed metal containing layer regions from the substrate, while the metal containing layer in the covered metal containing layer regions remains on the substrate to form a metal containing mask;

plasma etching the substrate; and removing the remaining metal containing layer from the substrate.

2. The method, as recited in claim 1, wherein the patterned mask is hardened by a fluorine plasma.

3. The method, as recited in claim 1 where in the vaporizing a metal containing material comprises heating the metal containing material to a temperature that provides a vapor pressure of the metal containing material greater than $10^{-3}$ mTorr.

4. The method, as recited in claim 1 further comprising hardening the remaining metal containing layer against plasma etching.

5. The method, as recited in claim 1, wherein removing the metal containing layer in the exposed metal containing layer regions is done by heating it.

6. The method, as recited in claim 1, wherein removing the metal containing layer in the exposed metal containing layer regions is done by iterativly removing part of the exposed metal containing layer until the exposed metal containing layer is substantially removed.

7. The method, as recited in claim 1, wherein removing the metal containing layer in the exposed metal containing layer regions is done by dissolving it in one of benzene, toluene, alcohol, water, and ether.

8. The method, as recited in claim 1, wherein removing at least part of the metal containing layer in the exposed metal containing layer regions is done by curing the photoresist during the photoresist formation step.

9. The method, as recited in claim 1, wherein the photoresist dissolves by a second solvent that does not dissolve the exposed metal containing layer regions.

10. The method, as recited in claim 1, wherein the substrate is substantially transparent.

11. The method, as recited in claim 10, wherein the substrate comprises quartz.

12. The method, as recited in claim 1, wherein the metal containing material is a metal halide, which metal-halide contains a halogen component selected from one of bromide, iodide, and chloride.

13. The method, as recited in claim 1, further comprising forming another metal containing mask on the substrate after the removing of the remaining metal containing layer from the substrate to form a phase shift reticle.

14. The method, as recited in claim 13 further comprising hardening the remaining metal containing layer against plasma etching.

15. The method, as recited in claim 14 where in the vaporizing a metal containing material comprises heating the metal containing material to a temperature that provides a vapor pressure of the metal containing material greater than $10^{-3}$ mTorr.

16. A phase shift reticle, formed by the method comprising:

vaporizing a metal containing material. through simple vaporization;

condensing the metal containing material on a substrate to form a metal containing layer on the substrate;

forming a patterned photoresist layer over the metal containing layer, defining exposed metal containing layer regions and covered metal containing layer regions;

removing the metal containing layer in the exposed metal containing layer regions from the substrate, while the metal containing layer in the covered metal containing layer regions remains on the substrate to form a metal containing mask;

plasma etching the substrate; and removing the remaining metal containing layer from the substrate.

17. The phase shift reticle, as recited in claim 16, the method further comprising forming another metal containing mask on the substrate after the removing of the remaining metal containing layer from the substrate to form a phase shift reticle.

18. The phase shift reticle, as recited in claim 17 where in the vaporizing a metal containing material comprises heating the metal containing material to a temperature that provides a vapor pressure of the metal containing material greater than $10^{-3}$ mTorr.

19. The phase shift reticle, as recited in claim 18, the method further comprises hardening the remaining metal containing layer against plasma etching.

* * * * *